United States Patent [19]
Chang

[11] Patent Number: 5,750,428
[45] Date of Patent: May 12, 1998

[54] SELF-ALIGNED NON-VOLATILE PROCESS WITH DIFFERENTIALLY GROWN GATE OXIDE THICKNESS

[75] Inventor: Kuang-Yeh Chang, Taipei, Taiwan

[73] Assignee: United Microelectronics Corp.

[21] Appl. No.: 722,799

[22] Filed: Sep. 27, 1996

[51] Int. Cl.$^6$ .................................................. H01L 21/336
[52] U.S. Cl. ........................... 438/264; 438/766; 438/770
[58] Field of Search .................................. 438/264, 766, 438/770

[56] References Cited

U.S. PATENT DOCUMENTS 5,393,684  2/1995  Ghezzi ..................................... 437/43
5,429,960  7/1995  Hong ....................................... 437/35

Primary Examiner—John Niebling
Assistant Examiner—Brendan Mee
Attorney, Agent, or Firm—Bacon & Thomas

[57] ABSTRACT

A method of fabricating a novel electrically erasable programmable read only memory (EEPROM) cell for use in semiconductor memories is disclosed herein. Since the degree of ion implantation in the substrate determines the thickness of the silicon dioxide. The proper thickness of the silicon dioxide can be determined by considering the particular dopant to be used and degree of ion implantation. a 50–100 angstroms silicon dioxide is chosen for an arsenic or phosphorus dopant, 1E14–1E15 atoms/cm$^2$, 100 KeV, ion implantation. A 150–350 angstroms silicon dioxide is chosen for an arsenic or phosphorus dopant, 1E11–1E13 atoms/cm$^2$, 100 KeV, ion implantation. The method includes the steps of: forming an isolation layer on a substrate to serve as an isolation; doping ions to form a lightly-doped region in the substrate; patterning a photoresist on the substrate; doping an ions to form a highly-doped region in the substrate; removing the photoresist; oxidizing the substrate to form a gate oxide and a tunnel oxide simultaneously; and forming a first polysilicon layer on the gate oxide and the tunnel oxide.

19 Claims, 3 Drawing Sheets

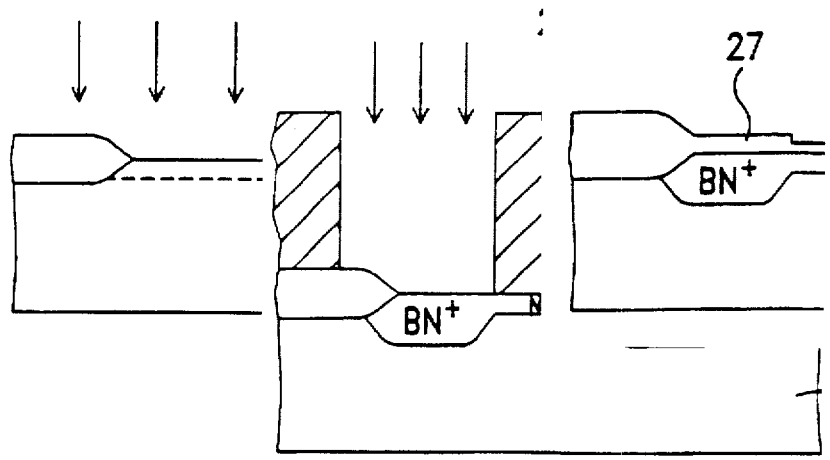
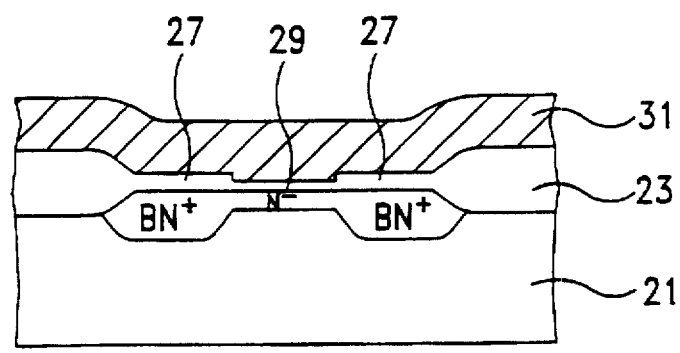
FIG.8
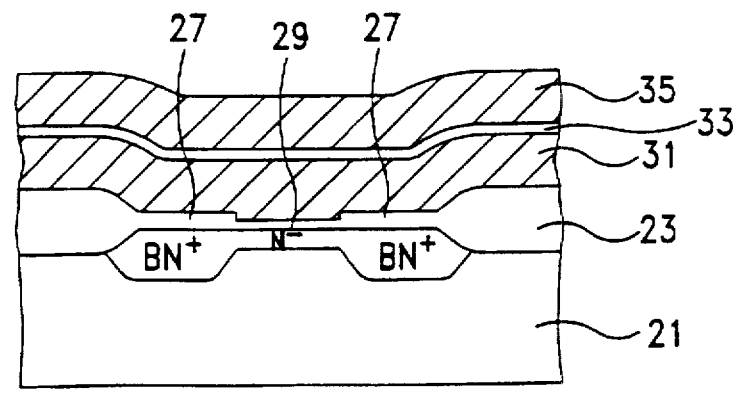
FIG.9

SELF-ALIGNED NON-VOLATILE PROCESS WITH DIFFERENTIALLY GROWN GATE OXIDE THICKNESS

FIELD OF THE INVENTION

The present invention relates to an electrically erasable programmable read only memory (EEPROM) cell and, more particularly, to a cell structure with differentially grown gate oxide thickness.

BACKGROUND OF THE INVENTION

The erasable non-volatile memory market has been divided for historical reasons into four fairly distinct product segments. These include the EAROM (electrically alterable ROMs), EEPROM, EEPROM-EAROMs and non-volatile SRAMs (static RAMs). Different types of devices have been developed for specific applications requirements in each of these segments. Low density (below 8 k) EAROMs have been used in such applications as consumer radio tuners, automotive engine controllers, etc. Medium density EEPROMs are often used in microprocessor based applications such as distributed systems or changeable software storage. These parts have been developed with a focus on high reliability and high speed environments.

Currently, the four basic technologies used to manufacture electrically reprogrammable ROMs typically utilize to some extent what is referred to as Fowler-Nordheim tunneling. Fowler-Nordheim tunneling is thought to be cold electron tunneling through the energy barrier at a silicon-silicon dioxide interface into the oxide conduction band. The earliest electrically reprogrammable ROM process in the early 1970s utilized a metal-nitride-oxide silicon (MNOS) combination for the gate region of a P-channel storage cell producing EAROMs. A novel type of nonvolatile MOSFET DRAM memory cell, introduced in late 1987, uses the electrical polarization of a ferroelectric capacitor to store information. The reported write speed is 200 ns in one design. Many memory manufacturers choose a thin oxide floating gate process to make an electrically erasable PROM. The basic memory cell consists of an access transistor and a double polysilicon storage cell with a floating polysilicon gate isolated in silicon dioxide capacitively coupled to a second polysilicon control gate which is stacked above it. The floating gate oxide is typically 50 nm thick, and the interpoly oxide is about 50 nm thick. The Fowler-Nordheim tunneling is used both to program and erase the floating-gate tunneling oxide (FLOTOX) transistor. FLOTOX-based EEPROMs are best suited for applications in which low-cost, low-density, nonvolatile memories are required, for example, in microcontrollers and programmable logic devices.

EEPROMs typically opearate in a program mode, an erase mode, and a read mode. In the program mode, the source region is held at a high positive voltage and the control gate is held at a negative voltage. Consequently, the EEPROM cell is programmed by Fowler-Nordheim tunneling of electrons through the thin gate oxide between the floating gate and the source region of the cell. Electrons tunneling from the floating gate to the source region leave the floating gate relatively more positively charged. The positively charged floating gate shifts the threshold voltage of the memory cell in the negative direction so that in the read mode the transistor will be 'on'. The programmed state corresponds to a logical '0' state in the cell (see "SEMICONDUCTOR MEMORIES A Handbook of Design, Manufacture, and Application", Betty Prince, Chapter 12).

In the erase mode, the control gate is held at high positive voltage while the drain region is grounded (i.e., coupled to a source of ground potential). Electrons tunnel through to the floating gate and the threshold voltage to shift in the positive direction so that in the read mode the transistor will be 'off'. The erased state correspouds to a logical '1' stored in the cell. In the read mode, the control gate is held at the integrated circuit supply voltage (Vcc), which would be lower than the threshold voltage of the EEPROM cell after being erased, but higher than the threshold voltage of the EEPROM cell after being programmed.

The thin tunneling oxide, generally about 10 nm, is usually isolated to a small area over the drain region, to facilitate tunnelling. Programming is achieved by applying a high positive voltage to the drain region and the control gate and grounding the source region. Hot electrons generated in the channel are injected into the floating gate resulting in an upward shift in threshold voltage. Erasure is achieved by cold electron emission of electrons from the floating gate.

The fabrication of FLOTOX EEPROMs involves a modification of the polysilicon gate MOS process. A double polysilicon process is used, together with a tunnel oxide growth process. The growth of a high quality, thin tunneling oxide is, in fact, the critical manufacturing step in this technology.

One conventional erasable programmable read only memory (EPROM) cell is shown in FIG. 1. A single crystal substrate 1 is <100> crystallographic orientation. First, a thick field oxide region (FOX) 3 is formed for the purposes of isolation. The FOX 3 region is created via photolithography and dry etching steps to etch a silicon nitride-silicon dioxide composite layer. After the photoresist is removed and wet cleaned, a thermal oxidation in an oxygen steam ambient is used to form the FOX 3 region, at a thickness about 4000–6000 angstroms.

Then a first photoresist 5 is pattern on the substrate 1. Subsequently, an ion implantation is used to form a buried $N^+(B \ N^+)$ bit line region 7. The dosage of the implantation is about 1E14–1E15 atoms/cm$^2$, the energy of this implantation is less than 100 KeV. Then the first photoresist 5 is stripped after the bit line region 7 is formed.

Turning to FIG. 2, a silicon dioxide layer 9 is formed on the substrate 1 to act as a gate oxide 9. The silicon dioxide layer is formed by using an oxygen ambient, at a temperature between about 850° to 1000° C., to a thickness about 100–300 angstroms. A second photoresist 11 is then patterned on the field oxide 3 and on the silicon dioxide layer 9. An opening is generated in the silicon dioxide layer 9 by using a wet etching to etch the silicon dioxide layer 9. The photoresist 11 is then removed.

Turning to FIG. 3, a thermal treatment is performed to the substrate 1. This step of the process is used to create a tunnel oxide 13. Similarily, the tunnel dioxide 13 is formed by using an oxygen ambient, at a temperature between about 850° to 1000° C., to a thickness about 50–100 angstroms. The silicon dioxide layer 9 became thicker due to the thermal treatment. A first polysilicon layer 15 is then formed over the silicon dioxide layer 9, tunnel oxide layer 13 and the field oxide regions 3. The first polysilicon layer 15 is formed using conventional chemical vapor deposition (CVD), which is served as a floating gate.

Referring next to FIGS. 4, a second silicon dioxide layer 17 is formed on the first polysilicon layer 15 for the purpose of isolation. Then a second polysilicon layer 19 is formed on the isolation layer 17 to act as a control gate.

Unfortunately, the conventional method to grow the tunnel oxide is not only complicated but also not easy to control the quality of the tunnel oxide.

SUMMARY OF THE INVENTION

A thick field oxide regions (FOX) are formed on a substrate for the purposes of isolation. Next, a blanket ion implantation is performed to create a light N-type impurity (N−)region. The dosage of the implantation is about the range of 1E11–1E13 atoms/cm$^2$, the energy of this ion implantation is about 100 KeV. A first photoresist is then pattern on the substrate and the field oxide regions. Subsequenly, a buried N-type highly-doped (BN$^+$) bit line region is created by means of a heavy dose ion implantation. Since the degree of ion implantation in the substrate determines the thickness of the silicon dioxide, the thickness of an oxide layer depends on the concentration (or dosage) of ions in the substrate. The proper thickness of the silicon dioxide can be determined by considering the dosage of the ion implantation. In the present invention, the dosage of the ion implantation is about the range of 1E14–1E15 atoms/cm$^2$ the energy of this ion implantation is about 100 KeV. The photoresist is removed after the ion implantation is done. A gate oxide layer and a tunnel oxide are formed on the substrate simultaneously by using an oxygen ambient, at a temperature between about 850° to 1000° C., to 5–15 minutes. The thickness of the oxide are dependant on the concentration of the dosage, respectively. Therefore, the thickness of the tunnel oxide is about 50–100 angstroms, and the gate oxide is formed to have a thickness about the range of 150–350 angstroms. A first polysilicon layer is then formed over the gate oxide layer the tunnel oxide, the substrate and the field oxide regions.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 7 is a cross section view of a semiconductor wafer illustrating the step of oxidizing the substrate to form a gate oxide and a tunnel oxide in accordance with the present invention;

FIG. 8 is a cross section view of a semiconductor wafer illustrating the step of forming a first polysilicon layer in accordance with the present invention; and FIG. 9 is a cross section view of a semiconductor wafer illustrating the step of forming a silicon oxide and a second polysilicon layer in accordance with the present invention;

DETAILED DESCRIPTION OF THE PREFERRED EMBODIMENT

The formation of the EEPROM cell with differentially grown gate oxide thickness described herein includes many process steps that are well known in the art. For example, the process of photolithographic masking is used extensively herein. This process consists of creating a photolithography mask containing the pattern of the component to be formed, coating the wafer with a light sensitive material known as a photoresist, exposing the photoresist coated wafer to ultraviolet light through the mask to soften or harden parts of the photoresist (depending on whether positive or negative photoresist is used), removing the softened parts of the photoresist.

Figure 1:
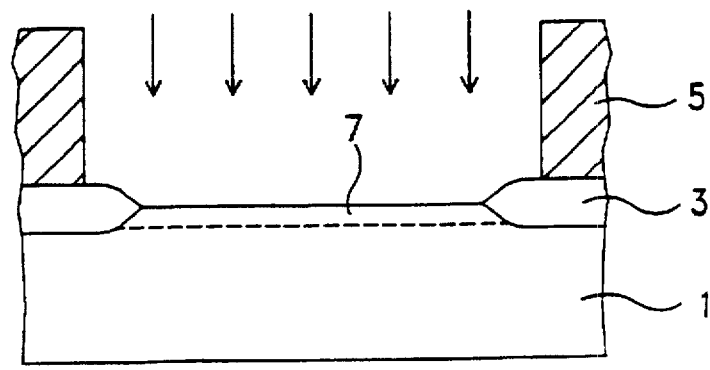
FIG. 1 is a cross section view of a semiconductor wafer illustrating the step of forming a buried N$^+$ region in accordance with the conventional method.
Figure 2:
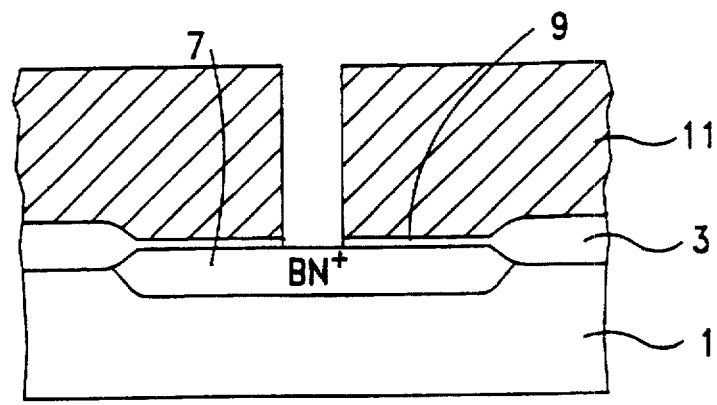
FIG. 2 is a cross section view of a semiconductor wafer illustrating the step of forming a gate oxide and forming an opening in the gate oxide in accordance with the conventional method.
Figure 3:
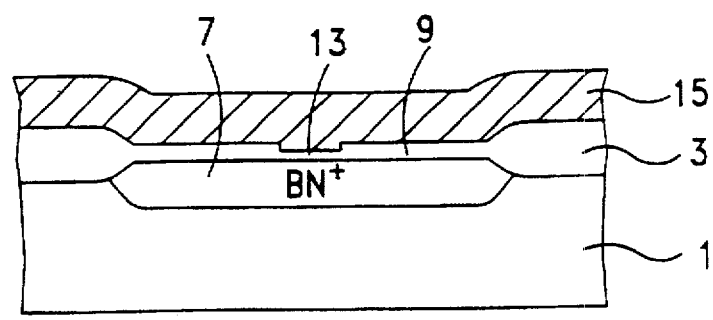
FIG. 3 is a cross section view of a semiconductor wafer illustrating the step of forming a tunnel oxide and a first polysilicon layer in accordance with the conventional method.
Figure 4:
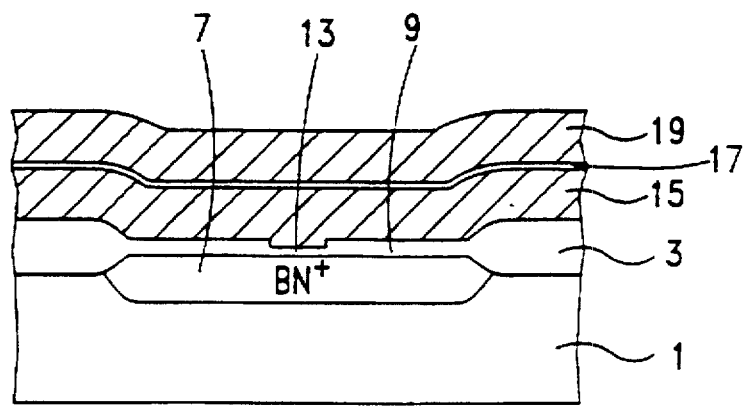
FIG. 4 is a cross section view of a semiconductor wafer illustrating the step of forming a silicon oxide and a second polysilicon layer in accordance with the conventional method.
Figure 5:
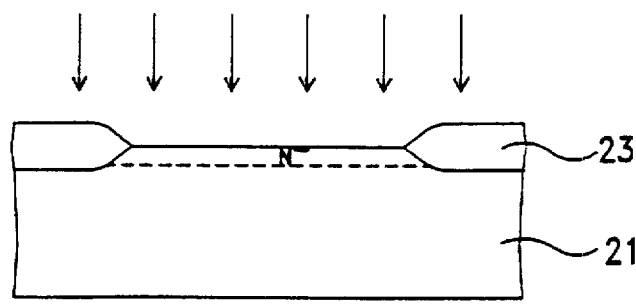
FIG. 5 is a cross section view of a semiconductor wafer illustrating the step of doping an ions to form a lightly-doped region in accordance with the present invention.

As will be seen below, this technique can be used to form one embodiment of an EEPROM cell in accordance with the present invention. Referring to FIG. 5, in this embodiment, a single crystal substrate 21 with a <100> crystallographic orientation is used. First, a thick field oxide regions (FOX) 23 are formed for the purposes of isolation. The FOX 23 regions are created via photolithography and dry etching steps to etch a silicon nitride-silicon dioxide composite layer. After the photoresist is removed and wet cleaned, a thermal oxidation in an oxygen ambient is used to form the FOX 23 regions, to a thickness about 4000–6000 angstroms.

Next, a blanket ion implantation is performed to creat a light N-type impurity (N−) region. In preferred embodiment, the dosage of the implantation is about the range of 1E11–1E13 atoms/cm$^2$, the energy of this ion implantation is about 100 KeV. The source of the ion implantation can be any suitable ions such as P$^+$ or As$^+$. The blanket ion implantation is carried out without a photo mask. It means that in the step no photoresist is introduced by performing the first ion implantation.

Figure 6:
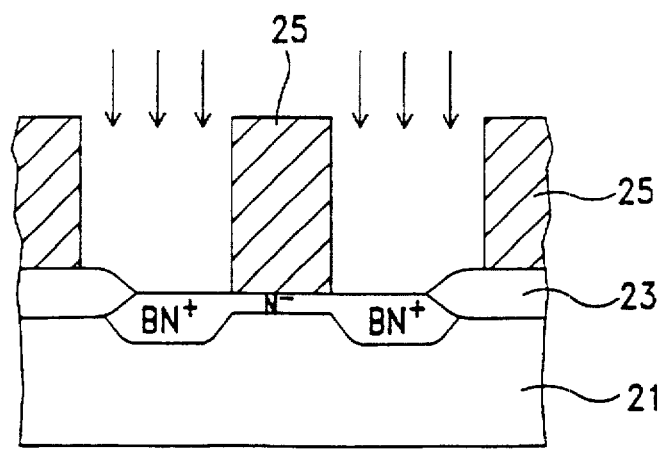
FIG. 6 is a cross section view of a semiconductor wafer illustrating the step of doping an ions to form a highly-doped region in accordance with the present invention.

Turning to FIG. 6, a first photoresist 25 is then pattern on the substrate 21 and the field oxide regions 23. Subsequenly, a buried N-type highly-doped (BN$^+$) bit line region is created by means of a heavy dose ion implantation. Since the degree of ion implantation in the substrate 1 determines the thickness of the silicon dioxide. That is, the more concentration of dopant is, the thicker of the silicon oxide is. The proper thickness of the silicon dioxide can be determined by considering the particular dopant to be used and degree of ion implantation. In this embodiment, the dosage of the ion implantation is about the range of 1E14–1E15 atoms/cm$^2$, the energy of this ion implantation is about 100 KeV. The source of the implantation could be any suitable ions such as P$^+$ or As$^+$. The photoresist 25 is removed after the ion implantation is done.

Referring next to FIGS. 7, a gate oxide layer 27 and a tunnel oxide 29 are formed on the substrate 1 simultanously by using an oxygen ambient, at a temperature between about 850° to 1000° C., to 5–15 minutes. The thickness of the oxide 27, 29 are dependant on the concentration of the dosage, respectively. For example, a 50–100 angstroms silicon dioxide is chosen for an arsenic or phosphorus dopant, 1E14–1E15 atoms/cm$^2$, 100 KeV, ion implantation. While a 150–350 angstroms silicon dioxide is chosen for an arsenic or phosphorus dopant, 1E11–1E13 atoms/cm$^2$, 100

KeV. ion implantation. Therefore, the thickness of the tunnel oxide is about 50–100 angstroms, and the gate oxide is formed to have a thickness about the range of 150–350 angstroms.

Turning to FIG. 8, a first polysilicon layer 31 is then formed over the gate oxide layer 27, the tunnel oxide 29, the substrate 21 and the field oxide regions 23. The first polysilicon layer 31 is formed using conventional chemical vapor deposition (CVD). It can be appreciated that other methods of depositing the first polysilicon layer 31 can also be used. The thickness of the first polysilicon layer 31 is optimally 1000–3000 angstroms. In this embodiment, the first polysilicon layer 31 is chosen from doped polysilicon or in-situ doped polysilicon. Further, the first polysilicon layer 31 is utilized to act a floating gate. The cell is used for single poly coupling. In addition, this cell can also be utilized for double polysilicon structure since tunnel oxide process is the same for both. The extra steps of formation for double polysilicon structure will be described as follows.

Referring next to FIGS. 9, a dielectric layer, such as a silicon dioxide layer 33, is formed on the first polysilicon layer 31 for isolation. The thickness of the isolation layer 33 have a thickness about 500 angstroms. Next, a second polysilicon spacer 35 is formed on the silicon dioxide layer 33. The second polysilicon forms a control gate.

The process of the invention is more simple than the conventional method. The thickness of the oxide layer can be easily controled by means of considering the particular dopant to be used and degree of ion implantation. Further, the gate oxide 27 and the tunnel oxide 29 can be formed simultaneously. Of course, the method can also be utilized to form a multi-thickness oxides.

As can be understood by those skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of fabricating an electrically erasable programmable read only memory (EEPROM) on a semiconductor substrate, said method comprising the steps of:

forming a plurality of isolation regions on said substrate to serve as isolations for an active region;

performing a first ion implant to form a lightly-doped region in said active region, wherein said first ion implantation is a blanket ion implantation and is performed without a photo mask;

patterning a photoresist on a portion of said active region;

performing a second ion implant to form a plurality of highly-doped regions in said substrate by using said photoresist as a doping mask;

removing said photoresist;

oxidizing said substrate to form a gate oxide over said substrate and a tunnel oxide layer over the portion of said active region with differential thickness, simultaneously, wherein said gate oxide is thicker than said tunnel oxide; and forming a first polysilicon layer on said gate oxide and said tunnel oxide.

2. The method of claim 1, further comprising the steps of:

forming an isolation layer on said first polysilicon layer; and forming a second polysilicon layer on said isolation layer.

3. The method of claim 1, wherein the dosage of said first ion implant is about 1E11–1E13 atoms/cm$^2$.

4. The method of claim 3, wherein the energy of said first ion implant is about 100 KeV.

5. The method of claim 1, wherein the dopant of said first ion implant is arsenic.

6. The method of claim 1, wherein the dopant of said said first ion implant is phosphorus.

7. The method of claim 1, wherein said highly-doped region is formed to have a dosage about 1E14–1E15 atoms/cm$^2$.

8. The method of claim 7, wherein the energy of said second ion implant is about 100 KeV.

9. The method of claim 1, wherein the dopant of said second ion implant is arsenic.

10. The method of claim 1, wherein the dopant of said second ion implant is phosphorus.

11. The method of claim 3, wherein said gate oxide is formed to have a thickness about 150–350 angstroms.

12. The method of claim 7, wherein said tunnel oxide is formed to have a thickness about 50–100 angstroms.

13. The method of claim 1, wherein the temperature of forming said gate oxide and said tunnel oxide is about 850°–1000° C.

14. A method of fabricating an oxide layer with different thickness, said method comprising:

performing a first ion implant to form a lightly-doped region in a semiconductor substrate, wherein said first ion implantation is a blanket ion implantation and is performed without a photo mask;

patterning a photoresist on a portion of said substrate;

performing a second ion implant to form highly-doped regions in said substrate by using said photoresist as a mask;

removing said photoresist; and oxidizing said substrate to form a silicon oxide layer, thickness of the silicon oxide layer over the lightly-doped region being thinner than thickness of the silicon oxide layer over the highly-doped regions.

15. The method of claim 14, wherein the dopant of said first ion implant is arsenic.

16. The method of claim 14, wherein the dopant of said first ion implant is phosphorus.

17. The method of claim 14, wherein the dopant of said second ion implant is arsenic.

18. The method of claim 14, wherein the dopant of said second ion implant is phosphorus.

19. The method of claim 14, wherein the temperature of forming said gate oxide and said tunnel oxide is about 850°–1000° C.

* * * * *